(12) United States Patent
Chiang et al.

(10) Patent No.: US 6,656,786 B2
(45) Date of Patent: Dec. 2, 2003

(54) MIM PROCESS FOR LOGIC-BASED EMBEDDED RAM HAVING FRONT END MANUFACTURING OPERATION

(75) Inventors: Min-Hsiung Chiang, Taipei (TW); Hsiao-Hui Tseng, Tainan (TW); Hsien-Yuan Chang, Taipei (TW); Tazy-Schiuan Yang, Chia-Yi (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/000,896

(22) Filed: Nov. 2, 2001

(65) Prior Publication Data

US 2003/0085419 A1 May 8, 2003

(51) Int. Cl.[7] .......................................... H01L 21/8242
(52) U.S. Cl. ...................... 438/241; 438/242; 438/396; 438/295
(58) Field of Search ................................ 438/241–244, 438/396, 393, 239, 253, 149, 171, 295

(56) References Cited

U.S. PATENT DOCUMENTS 5,994,197 A * 11/1999 Liao ........................... 438/396
6,285,050 B1 * 9/2001 Emma et al. ................ 257/296

* cited by examiner

Primary Examiner—Carl Whitehead, Jr.
Assistant Examiner—Yennhu B Huynh
(74) Attorney, Agent, or Firm—Tung & Associates

(57) ABSTRACT

A method and system for manufacturing an MIM capacitor for utilization with a logic-based embedded DRAM device. At least one transistor, an interlayer dielectric, at least one contact and at least one metal one layer are generally formed on a substrate during a front end manufacturing operation of the capacitor on the substrate. An inter-metal dielectric layer is deposited upon the substrate, followed thereafter by a chemical mechanical polishing operation. Additionally, a lithographic operation is performed upon the substrate. Also, at least one dielectric deposition layer is generally on the substrate, followed thereafter by a chemical mechanical polishing operation and a stop on an oxide layer formed on the substrate. At least one metal two layer may then be formed on substrate and associated layers thereof, thereby resulting in the formation of a capacitor fully compatible with logic-based devices and processes thereof.

12 Claims, 6 Drawing Sheets

MIM PROCESS FOR LOGIC-BASED EMBEDDED RAM HAVING FRONT END MANUFACTURING OPERATION

TECHNICAL FIELD

The present invention relates to a semiconductor device and manufacturing method thereof. More specifically, the present invention relates to a semiconductor device having a capacitor and a contact plug in a DRAM (Dynamic Random Access Memory) or the like, and to a manufacturing method thereof. The present invention also relates to MIM capacitor fabrication methods and systems. The present invention also relates to logic-based embedded DRAM devices and manufacturing methods thereof.

BACKGROUND OF THE INVENTION

In the integrated circuit (IC) industry, manufacturers are currently imbedding dynamic random access memory (DRAM) arrays on the same substrate as CPU cores or other logic devices. This technology is being referred to as embedded DRAM (eDRAM). Embedded DRAM generally can provide microcontroller (MCU) and other embedded controllers faster access to larger capacities of on-chip memory at a lower cost than that currently available using conventional embedded static random access memory (SRAM) and/or electrically erasable programmable read only memory (EEPROM).

A semiconductor memory, such as a DRAM or embedded DRAM, mainly consists of a transistor and a capacitor. Therefore, improvement in the efficiency of these two structures tends to be the direction in which technology is developing. DRAM is generally a volatile memory, and the way to store digital signals is decided by charge or discharge of the capacitor in the DRAM. When the power applied on the DRAM is turned off, the data stored in the memory cell completely disappears. A typical DRAM cell usually includes at least one field effect transistor (FET) and one capacitor. The capacitor is used to store the signals in the cell of DRAM. If more charges can be stored in the capacitor, the capacitor has less interference when the amplifier senses the data. In recent years, the memory cell of a DRAM has been miniaturized more and more from generation to generation. Even if the memory cell is minimized, a specific charge is essentially stored in the storage capacitor of the cell to store the information.

When the semiconductor enters the deep sub-micron process, the size of the device becomes smaller. For the conventional DRAM structure, this means that the space used by the capacitor becomes smaller. Since computer software is gradually becoming huge, even more memory capacity is required. In the case where it is necessary to have a smaller size with an increased capacity, the conventional method of fabricating the DRAM capacitor needs to change in order to fulfill the requirements of the trend.

There are two approaches at present for reducing the size of the capacitor while increasing its memory capacity. One way is to select a high-dielectric material, and the other is to increase the surface area of the capacitor.

There are two main types of capacitor that increase capacitor area. These are the deep trench-type and the stacked-type, where digging out a trench and filling the trench with a conductive layer, a capacitive dielectric layer and a conductive layer in sequence for the capacitor form the deep trench-type capacitor.

When a dielectric material with a relatively high dielectric constant is used in a stacked capacitor, the materials for manufacturing the upper and the bottom electrodes need to be gradually replaced in order to enhance the performance of the capacitor. A structure known as a metal-insulator-metal (MIM) structure possesses a low-interfacial reaction specificity to enhance the performance of the capacitor. Therefore, it has become an important topic of research for the semiconductor capacitor in the future.

Cell areas are reduced, as a semiconductor device needs ultra-high integrity. Thus, many studies for increasing the capacitance of a capacitor are being developed. There are various ways of increasing the capacitance such as forming a stacked or trench typed three-dimensional structure, whereby a surface area of a dielectric layer is increased.

In order to constitute a cell area in a DRAM fabrication, transistors and the like are formed on a semiconductor substrate, storage and plate electrodes of polycrystalline silicon and a dielectric layer are formed wherein the dielectric layer lies between the electrodes, and metal wires are formed to connect the devices one another.

The obtainable capacitance of the storage capacitor tends to decrease dependent upon the level of the miniaturization of the storage cell. On the other hand, the necessary capacitance of the capacitor is almost constant when the storing voltage to be applied across the capacitor is fixed. Therefore, it is necessary for the capacitor to compensate the capacitance decrease due to the miniaturization by, for example, increasing the surface area of the capacitor. This surface area increase has been popularly realized by increasing the thickness of the lower electrode (or, storage electrode) of the capacitor. A typical capacitor utilized in DRAM fabrication is the Metal Insulator Metal (MIM) capacitor, which is usually located in the memory region of DRAM and embedded DRAM to increase the capacitance of the capacitor.

To integrate logic and memory devices in a single chip configuration without degrading transistor performance, low-temperature MIM capacitors with $Ta_2O_5$ or BST as a dielectric material are currently used in the semiconductor manufacturing arts. In conventional MIM capacitor manufacturing processes, the total number of additional lithography steps generally required to manufacture capacitors in the BEOL process is in the range of 2 to 3. In order to manufacture SOC memory devices, however, additional lithography steps may be required. Additional lithography steps, however, increase mask add-on costs. Thus, the present inventor has concluded that a need exists for a new process for manufacturing logic-based embedded DRAM, including MIM capacitors thereof, without increasing mask add-on costs as one or more back-end lithography steps are added. The present invention thus introduces a novel process that generally adds only one back-end lithography step for MIM capacitor manufacturing, while greatly reducing mask add-on costs, thereby leading to the feasibility of SOC memory manufacturing processes.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

It is therefore one aspect of the present invention to provide an improved semiconductor fabrication method and system.

It is another aspect of the present invention to provide a method and system for fabricating a MIM capacitor.

It is yet another aspect of the present invention to provide a method and system for fabricating an MIM (metal insulator metal) capacitor utilized in an embedded DRAM-based semiconductor device.

The above and other aspects of the present invention are achieved as is now described. A method and system is disclosed herein for manufacturing an MIM capacitor for utilization with a logic-based embedded DRAM device. At least one transistor, an interlayer dielectric, at least one contact and at least one metal one layer are generally formed on a substrate during a front end manufacturing operation of the capacitor on the substrate. An inter-metal dielectric layer is deposited upon the substrate, followed thereafter by a chemical mechanical polishing operation. The inter-metal dielectric layer comprises an IMD1 layer. Additionally, a lithographic operation is performed upon the substrate. Also, at least one dielectric deposition layer is generally on the substrate, followed thereafter by a chemical mechanical polishing operation and a stop on an oxide layer formed on the substrate. At least one metal two layer may then be formed on substrate and associated layers thereof, thereby resulting in the formation of a capacitor fully compatible with logic-based devices and processes thereof, while alleviating process incompatibility. The front end manufacturing operation can comprise an FEOL manufacturing process. The dielectric deposition layer may be configured as a layer formed from $Ta_2O_5$ (or BST) and/or in combination with TiN and W. The lithographic operation may comprise a DRAM cell node lithography operation. Following the performance of such a lithographic operation, a plug may be formed upon the substrate and associated layers thereof. Thereafter, an etch back operation may be performed upon the substrate and associated layers thereof. Following the deposition of the inter-metal dielectric layer upon the substrate. A chemical polishing operation may be performed, followed by a patterning operation, and the formation of at least one plug. The MIM capacitor formed as a result of the aforementioned semiconductor manufacturing steps may comprise a low temperature MIM capacitor that can be readily integrated with embedded DRAM devices utilizing at least one W-plug of at least one metal two layer formed upon the substrate.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate embodiments of the present invention and are not intended to limit the scope of the invention.

Figure 1:
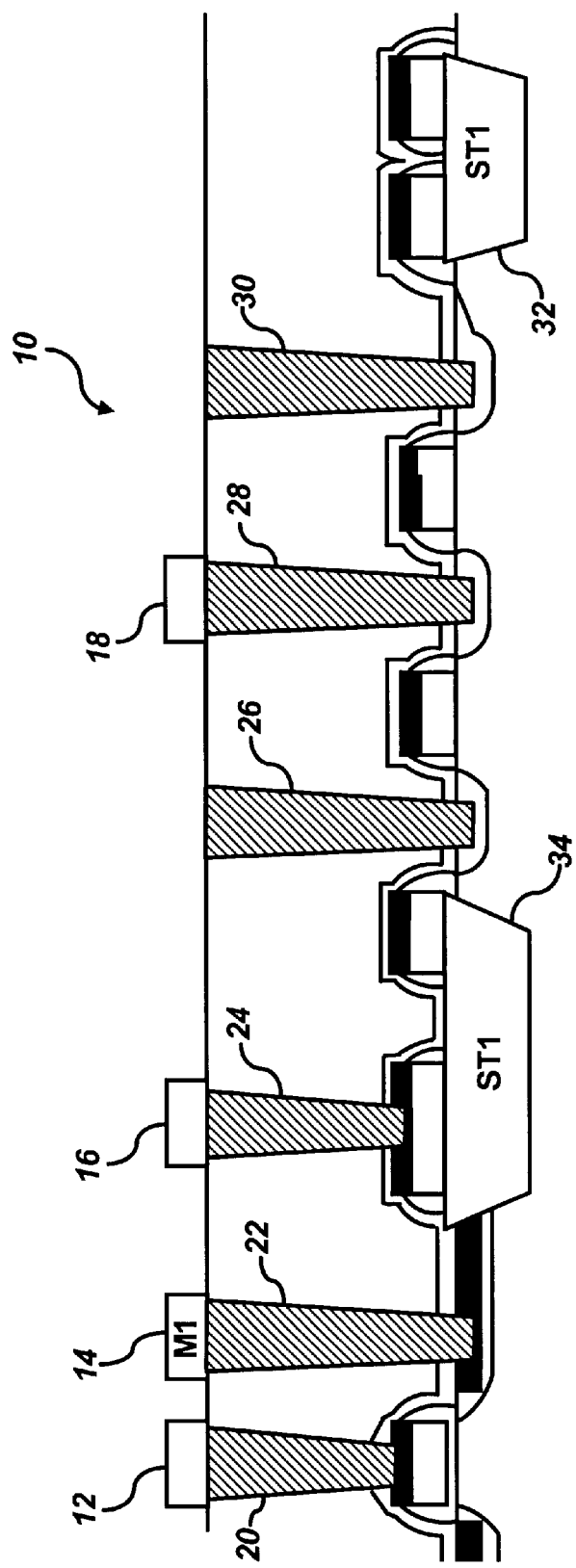
FIG. 1 illustrates a first step of a semiconductor fabrication process, in accordance with a preferred embodiment of the present invention.

FIG. 1 illustrates a first step 10 of a semiconductor fabrication process, in accordance with a preferred embodiment of the present invention. Capacitors can be formed during a front-end-of-the-line (FEOL) process utilized to fabricate semiconductor devices. FIG. 1 thus indicates that a FEOL process may be utilized to form transistors. An interlayer dielectric (ILD) may also be formed along with a contact. M1 formation also takes place through processing of first step 10 of FIG. 1. Metal one layers 12, 14, 16, and 18 are generally depicted in FIG. 1. Additionally, as illustrated in FIG. 1, a contact photo and etch takes place, along with W-plug formation, an M1 (i.e., metal one) sputter, which may be followed by an M1 photo and etch operation. Also illustrated in FIG. 1 are plugs 20, 22, 24, 26, 28 and 30. Additionally, substrates ST1 (i.e. see reference numeral 34) and ST1 (i.e., see reference numeral 32) are depicted in FIG. 1. Note that in FIGS. 1 to 5 herein, analogous parts are indicated by identical reference numerals. It is important to note that the acronyms utilized herein with reference to FIGS. 1 to 6, such as, for example, ST1, ILD and FEOL are well known in the semiconductor arts.

Figure 2:
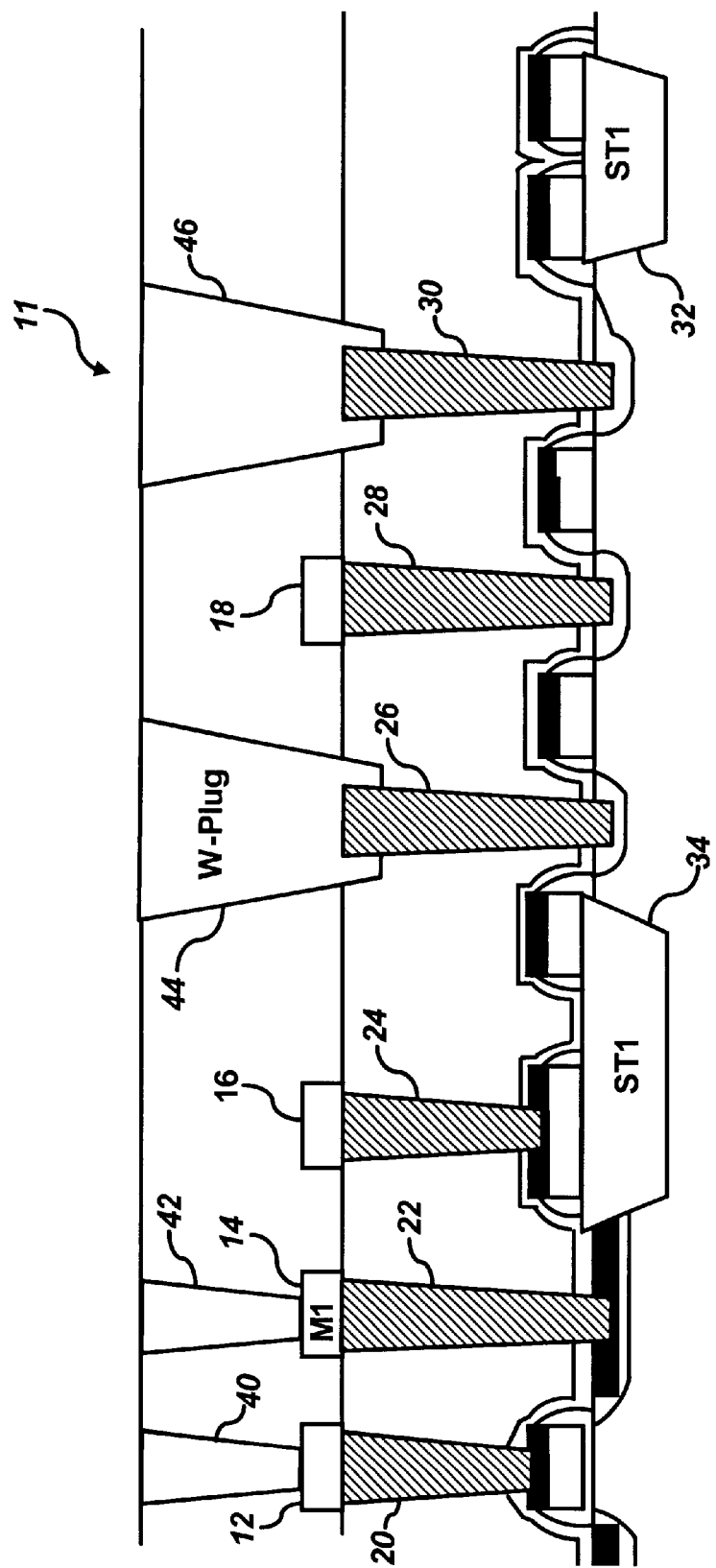
FIG. 2 illustrates a second step of a semiconductor fabrication process, in accordance with a preferred embodiment of the present invention.

FIG. 2 illustrates a second step 11 of a semiconductor fabrication process, in accordance with a preferred embodiment of the present invention. In second step 11, an inter-metal dielectric (IMD) layer, referred to as IMD1, may be formed between two metal layers for isolation. Note that since a metal layer and a dielectric layer are alternately laminated to form metal interconnects, the planarization of the dielectric layer is generally more important. If the result of the planarization is not ideal, the uneven surface of the dielectric layer may cause misalignment while a subsequent photolithography process can be performed so that the pattern cannot accurately transfer onto the metal line and the process becomes more difficult. Thus, according to FIG. 2, IMD1 deposition takes place, followed by a chemical mechanical polishing operation (CMP) and VIA1 patterning, which are followed by the formation of W-plug structures. W-plugs 44 and 46 are illustrated in FIG. 2, along with plugs 40 and 42.

In general, in fabricating microelectronic semiconductor devices and the like on a wafer substrate or chip, e.g., of silicon, to form an integrated circuit (IC), etc., various metal layers and insulation layers are deposited in selective sequence. To maximize integration of device components in the available substrate area to fit more components in the same area, increased IC miniaturization is utilized. Reduced pitch dimensions are needed for denser packing of components per present day very large scale integration (VLSI), e.g., at sub-micron (below 1 micron, i.e., 1,000 nanometer or 10,000 angstrom) dimensions.

One type of wet chemical process used in the IC fabrication of a semiconductor wafer involves the chemical mechanical polishing (CMP) of a surface of the wafer against a polishing pad during relative periodic movement there between, such as with a caustic slurry containing finely divided abrasive particles, e.g., colloidal silica in an aqueous potassium hydroxide (KOH) solution, as the polishing liquid. This removes, i.e., by chemical etching and mechanical abrasion, a thin layer of material, e.g., of 1 micron or less thickness, so as to planarize a top surface of the wafer. Close control of the slurry flow rate, temperature and pH are necessary to attain in a reproducible manner a uniform removal rate per the CMP operation.

Thus, one potential type of CMP process, for example, that may be utilized in accordance with an implementation of the present invention may involve the introduction of a slurry from a stationary overlying tube drop-wise onto a polishing pad of a rotating table (platen) which rotates about a stationary platen axis and against which the wafer, which is carried by a retaining ring, makes frictional contact while the wafer and ring rotate and oscillates relative to the platen. The wafer is positioned in a medial aperture of the ring such that the ring also makes frictional contact with the polishing pad. As the position of the wafer relative to the platen varies during wafer rotation and oscillation, the slurry dispensing tube is always spaced a minimum clearance distance from the wafer. Those skilled in the art can appreciate, however, that other types of CMP processes may be utilized in accordance with the methods and systems of the present invention.

Figure 3:
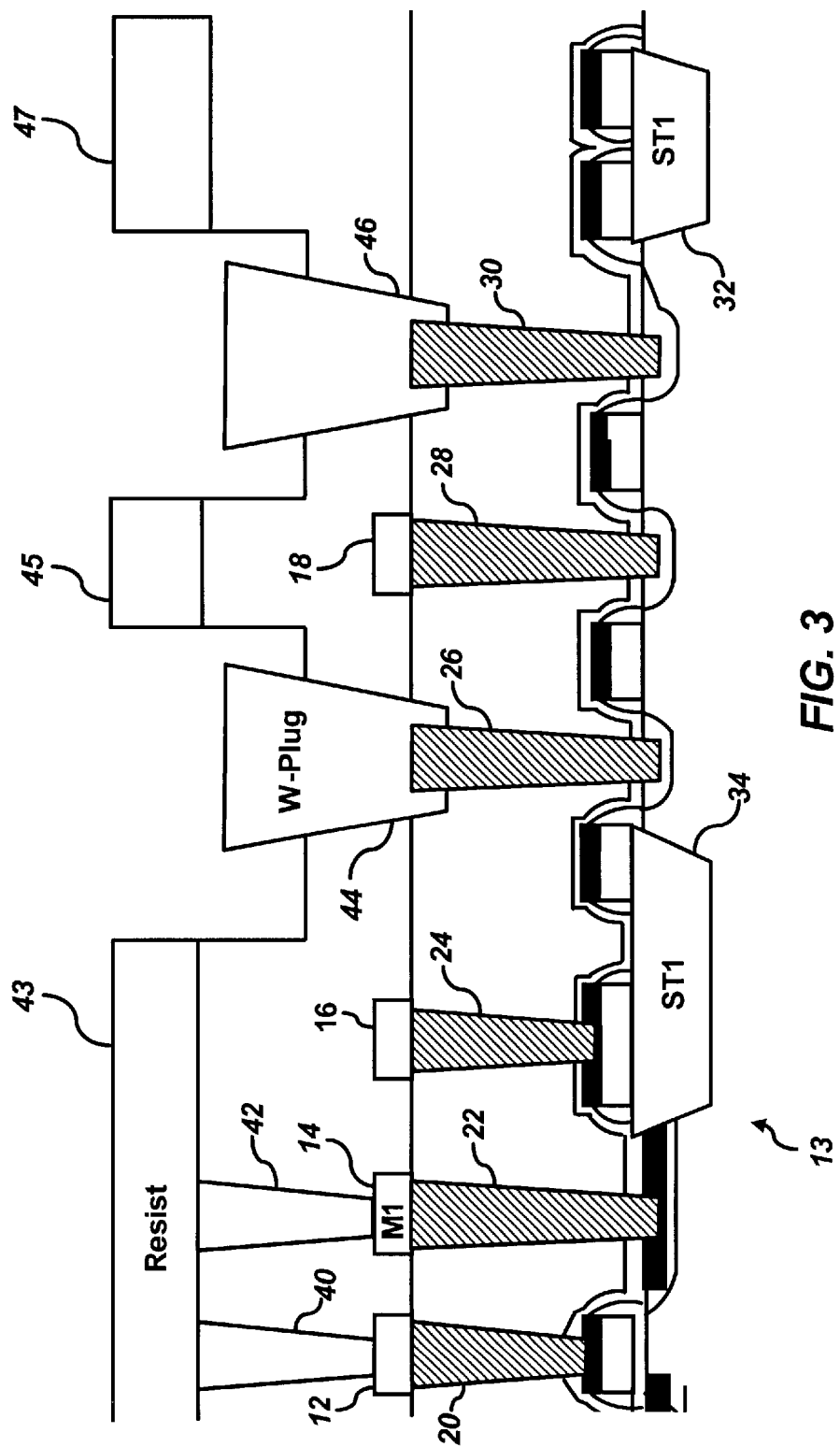
FIG. 3 depicts a third step of a semiconductor fabrication process, in accordance with a preferred embodiment of the present invention.
Figure 4:
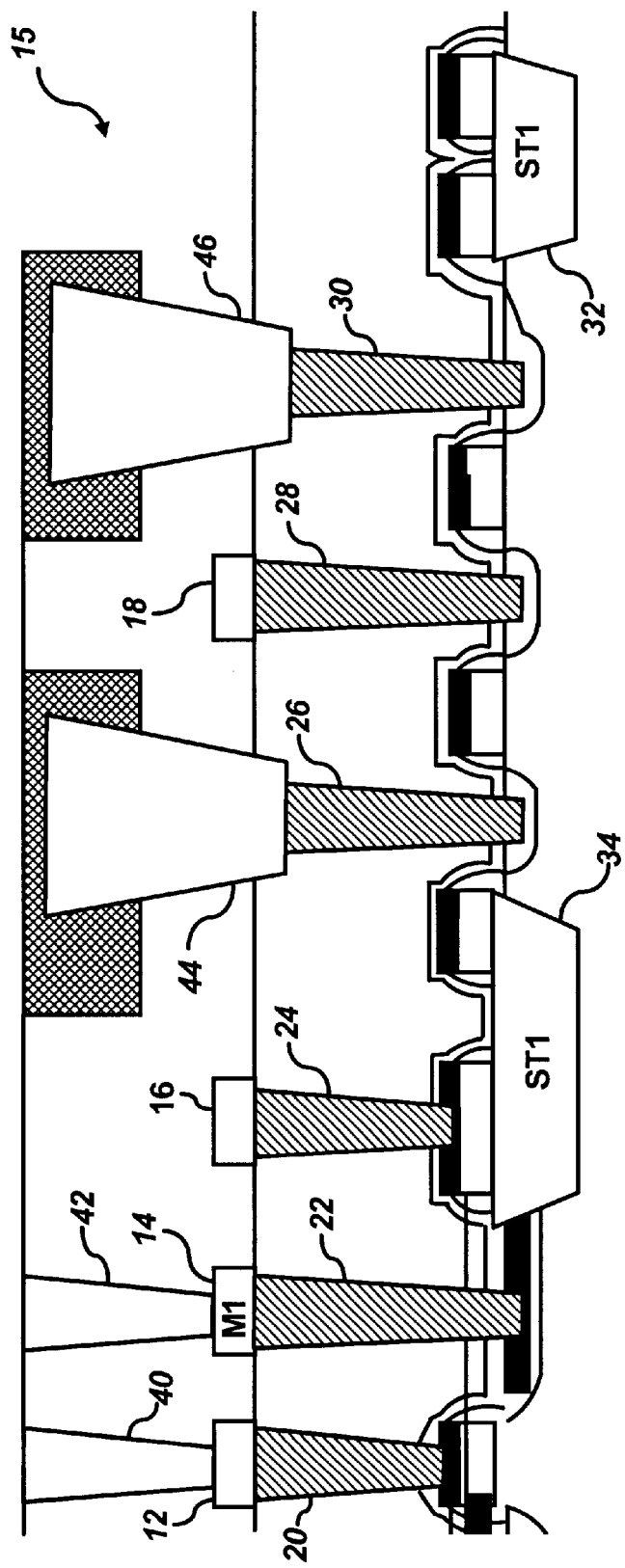
FIG. 4 illustrates a fourth step of a semiconductor fabrication process, in accordance with a preferred embodiment of the present invention.

FIG. 3 depicts a third step 13 of a semiconductor fabrication process, in accordance with a preferred embodiment of the present invention. Third step 13 involves DRAM cell node lithography, followed by an oxide/W-plug etch back. Resist layers 43, 45, and 47 are also illustrated in FIG. 3. Note that a photo mask can be utilized to open a DRAM node region. FIG. 4 illustrates a fourth step 15 of a semiconductor fabrication process, in accordance with a preferred embodiment of the present invention. As indicated in FIG. 4, a high dielectric constant material, such as, for example, $Ta_2O_5$ (or BST) and titanium nitride (TiN), and then W layer, may be layered in deposition operations, followed by a CMP (Chemical Mechanical Polishing) operation and a subsequent stop on an oxide layer.

Figure 5:
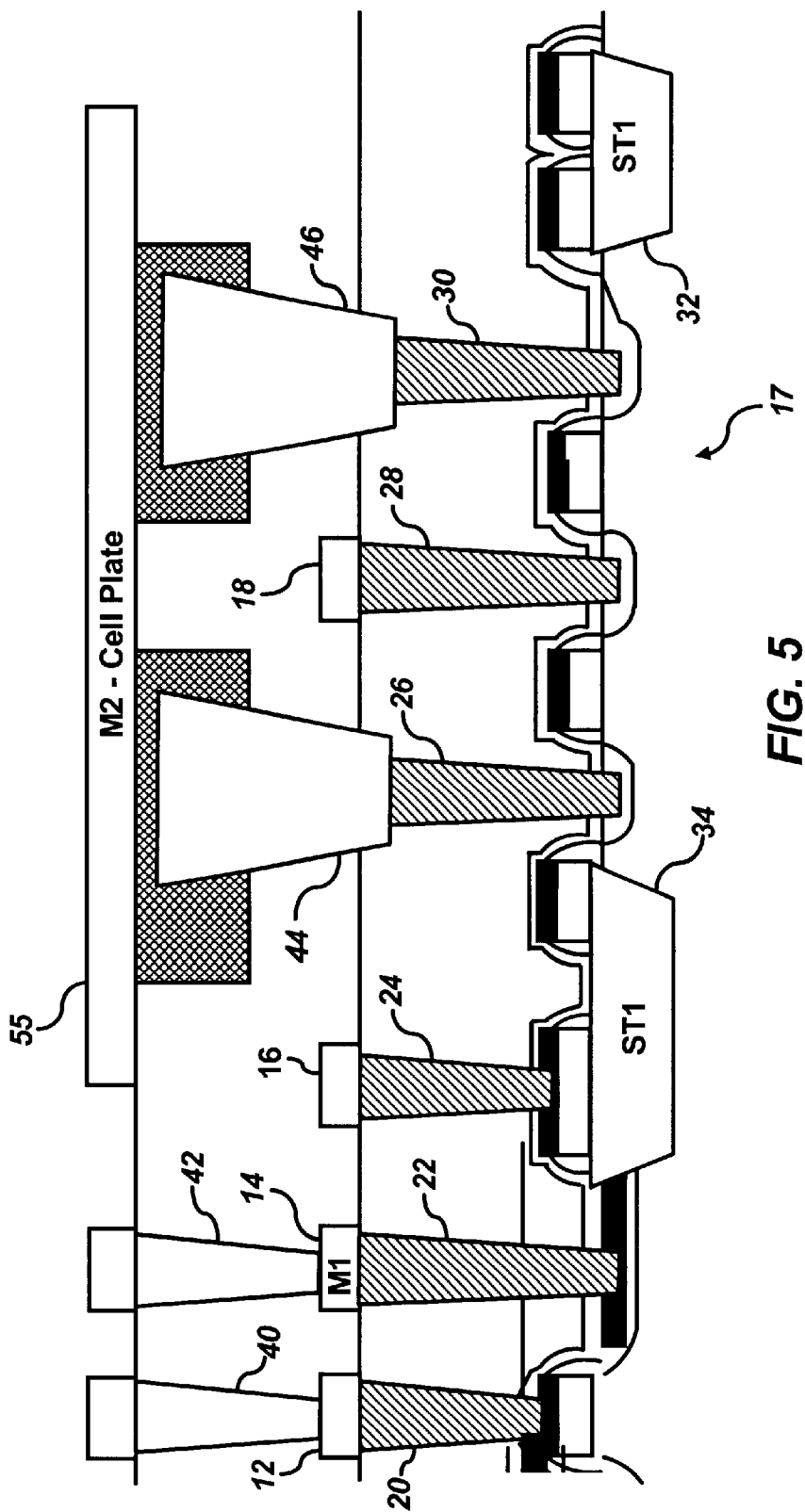
FIG. 5 depicts a fifth step of a semiconductor fabrication process, in accordance with a preferred embodiment of the present invention.

FIG. 5 depicts a fifth step 17 of a semiconductor fabrication process, in accordance with a preferred embodiment of the present invention. The configuration illustrated in FIG. 5 involves an M2 (metal two) layer formation, as indicated by cell plate 55, which comprises an M2 cell plate. An M2 sputter operation and M2 photo and etch operations are performed to implement fifth step 17 of FIG. 5. Following M2 formation, as indicated in FIG. 1, back-end-of-the-line (BEOL) wiring processes may also be implemented. BEOL wiring processes are well-known in the art and are typically utilized in the manufacture of semiconductor devices.

Figure 6:
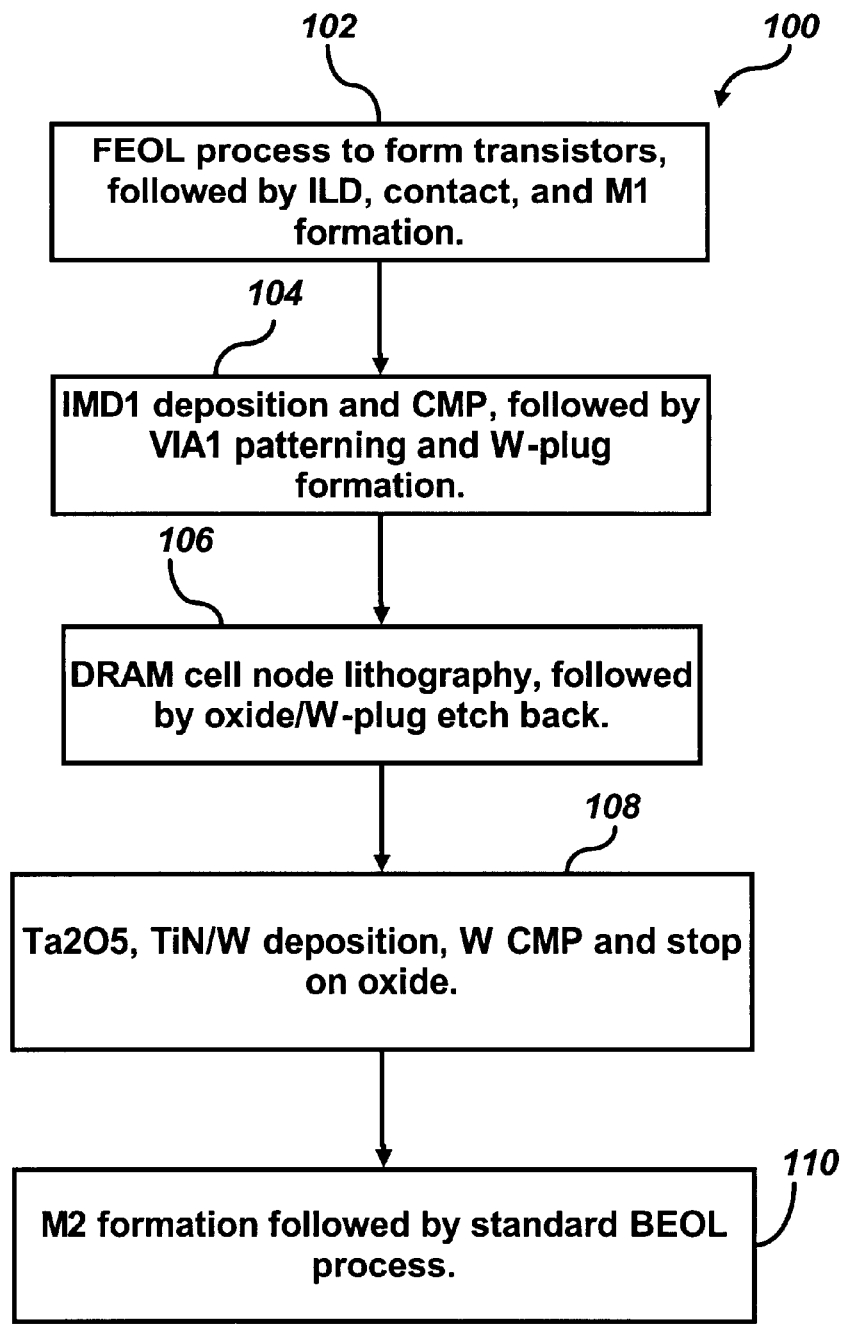
FIG. 6 illustrates a flow chart of operations illustrating operational steps that may be followed to implement a preferred embodiment of the present invention.

FIG. 6 illustrates a flow chart 100 of operations illustrating logical operational steps that may processed to manufacture an embedded MIM capacitor for utilization with embedded DRAM devices, in accordance with a preferred embodiment of the present invention. Thus, as depicted at block 102, a FEOL process may be utilized to form transistors. An interlayer dielectric (ILD) may also be formed along with a contact. M1 formation also takes place, as illustrated at block 102. Note that examples of metal one layers are indicated as metal one layers 12, 14, 16, and 18 in FIG. 1. Additionally, a contact photo and etch may take place, along with W-plug formation, an M1 (i.e., metal one) sputter, which may be followed by an M1 photo and etch operation.

As illustrated thereafter at block 104, an inter-metal dielectric (IMD) layer, referred to as IMD1, may be formed between two metal layers for isolation. As indicated at block 104, IMD1 deposition takes place, followed by a chemical mechanical polishing operation (CMP) and VIA1 patterning, which are followed by the formation of W-plug structures.

As described next at block 106, a DRAM cell node lithography operation may be performed, followed by an oxide/W-plug etch back. A photo mask can be utilized to open a DRAM node region. Thereafter, as depicted at block 108, a high dielectric constant material, such as, for example, $Ta_2O_5$ (or BST), titanium nitride (TiN), and then the W layer, may be layered in deposition operations, followed by CMP (Chemical Mechanical Polishing) operation and a subsequent stop on an oxide layer.

Finally, as illustrated at block 110, an M2 (metal two) layer may be configured upon said substrate and associated layers thereof in the form of an M2 cell plate. An M2 sputter operation and M2 photo and etch operations can be performed in accordance with the operation illustrated at block 110. Following M2 formation, back-end-of-the-line (BEOL) wiring processes may also be implemented.

Thus, the present invention may summarized with respect to the following itemized semiconductor processing operation:

1. FEOL process to form the transistors, and then ILD, M1 formation.
2. IMD1 deposition and CMP, VIA1 patterning, and then W-plug formation.
3. DRAM cell node lithography, then oxide/W-plug etching back.
4. $Ta_2O_5$ (or BST), titanium nitride (TiN)and W are deposition with CMP and a stop on oxide.
5. M2 formation followed by standard BEOL (i.e., back end) manufacturing processes.

Note in general that a conventional semiconductor integrated circuit may be classified in response to a signal process mode as a digital type of integrated circuit (i.e., a logic circuit) in which an output signal is changed to an on/off type by a variation of input signal and an analog type of integrated circuit (i.e., analog circuit) in which an output signal linearly varies with a variation of input signal. Since the above-mentioned integrated circuits serve to memorize information in response to whether or not charge in capacitor is present without distinction between a digital type and an analog type, in order to maintain normal operation characteristic of the circuits, a capacitor must be fabricated lest its capacitance vary with the variation of temperature or voltage while its device is manufactured. The MIM capacitor that may be fabricated according to the methods and systems described herein thus comprises a low-temperature MIM capacitor.

Based on the foregoing, it can be appreciated that several key semiconductor-manufacturing advantages can be obtained through an implementation of the method and system of the present invention. First, only one extra mask layer is required in the memory cell capacitor process. Second, low-temperature MIM capacitors manufactured according to the processing steps described herein can be readily integrated with other semiconductor devices utilizing the W-plugs of a metal two level. Third, the method and system described herein, including specific process implementations, is fully compatible with logic processes, thus greatly alleviating problems associated with process incompatibility, while making the manufacturing processes thereof cost effective.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is thus not intended to be exhaustive or to limit the scope of the invention. Many modifications and variations are possible in light of the above teaching without departing from scope of the following claims. It is contemplated that the use of the present invention can involve components having different characteristics. It is intended that the scope of the present invention be defined by the claims appended hereto, giving full cognizance to equivalents in all respects.

What is claimed is:

1. A method for manufacturing a capacitor for utilization with a logic-based DRAM device, said method comprising the steps of:

providing a substrate;

forming at least one transistor, an interlayer dielectric, at least one contact and at least one first metal layer on said substrate during a front end manufacturing operation of said capacitor on said substrate;

thereafter depositing an inter-metal dielectric layer upon said substrate, followed thereafter by a chemical mechanical polishing operation;

thereafter forming at least one dielectric deposition layer on said substrate, followed thereafter by a chemical mechanical polishing operation and a stop on an oxide layer formed on said substrate; and thereafter forming at least one second metal layer on said substrate and associated layers thereof, thereby resulting in the formation of a capacitor fully compatible with logic-based devices and processes thereof, while alleviating process incompatibility.

2. The method of claim 1 wherein said front end manufacturing operation comprises an FEOL manufacturing process.

3. The method of claim 1 wherein said at least one dielectric deposition layer comprises a layer formed from $Ta_2O_5$ or BST.

4. The method of claim 3 wherein said at least one dielectric deposition layer comprises a titanium nitride (TiN) and W layers.

5. The method of claim 1 wherein said lithographic operation comprises a DRAM cell node lithography operation.

6. The method of claim 5 wherein the step of performing a lithographic operation upon said substrate further comprises the step of:

performing a lithographic operation upon said substrate;

forming a plug upon said substrate and associated layers thereof; and thereafter performing an etch back operation upon said substrate and associated layers thereof.

7. The method of claim 1 wherein the step of depositing an inter-metal dielectric layer upon said substrate, followed thereafter by a chemical mechanical polishing operation, further comprises the steps of:

depositing an inter-metal dielectric layer upon said substrate;

performing a chemical mechanical polishing operation;

performing a patterning operation; and forming at least one plug upon said substrate and associated layers thereof.

8. The method of claim 1 wherein said capacitor comprises an MIM capacitor.

9. The method of claim 8 wherein said MIM capacitor comprises a low temperature MIM capacitor that may be readily integrated utilizing at least one W-plug of at least one metal two layer formed upon said substrate.

10. The method of claim 1 wherein said DRAM device comprises an embedded DRAM device.

11. The method of claim 1 wherein said inter-metal dielectric layer comprises an IMD1 layer.

12. A method for manufacturing an MIM capacitor for utilization with a logic-based embedded DRAM device, said method comprising the steps of:

providing a substrate;

forming at least one transistor, an interlayer dielectric, at least one contact and at least one first metal layer on said substrate during a front end manufacturing operation of said capacitor on said substrate;

thereafter depositing an inter-metal dielectric layer upon said substrate;

thereafter performing a chemical mechanical polishing operation;

thereafter performing a patterning operation;

thereafter forming at least one plug upon said substrate and associated layers thereof;

thereafter performing a lithographic operation upon said substrate;

thereafter forming a plug upon said substrate and associated layers thereof;

thereafter performing an etch back operation upon said substrate and associated layers thereof thereafter forming at least one dielectric deposition layer on said substrate, followed thereafter by a chemical mechanical polishing operation and a stop on an oxide layer formed on said substrate; and thereafter forming at least one second metal layer on said substrate and associated layers thereof, thereby resulting in the formation of an MIM capacitor fully compatible with embedded DRAM logic devices and processes thereof, while alleviating process incompatibility, such that said MIM capacitor that may be efficiently integrated with associated DRAM logic devices utilizing at least one W-plug of said at least one metal two layer formed upon said substrate.

* * * * *